US006624779B2

(12) United States Patent
Hochschild

(10) Patent No.: US 6,624,779 B2
(45) Date of Patent: Sep. 23, 2003

(54) SWITCHED CAPACITOR INTEGRATOR THAT SHARES A CAPACITOR FOR INPUT SIGNAL AND REFERENCE SIGNAL

(75) Inventor: James R. Hochschild, Plano, TX (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 10/127,735

(22) Filed: Apr. 22, 2002

(65) Prior Publication Data

US 2002/0186069 A1 Dec. 12, 2002

Related U.S. Application Data

(60) Provisional application No. 60/288,875, filed on May 4, 2001.

(51) Int. Cl.[7] ............................................ H03M 1/12

(52) U.S. Cl. ........................ 341/172; 341/155; 341/144

(58) Field of Search ................................ 341/172, 150, 341/139

(56) References Cited

U.S. PATENT DOCUMENTS 5,574,457 A * 11/1996 Garrity et al. .............. 341/172
5,894,284 A * 4/1999 Garrity et al. .............. 341/172
5,990,819 A * 11/1999 Fujimori ..................... 341/150
6,087,970 A * 7/2000 Panicacci .................... 341/172
6,148,048 A * 11/2000 Kerth et al. ................ 341/139
6,304,608 B1 * 10/2001 Chen et al. ................. 341/144
6,362,770 B1 * 3/2002 Miller et al. ................ 341/172

* cited by examiner

*Primary Examiner*—Michael Tokar
*Assistant Examiner*—Lam Mai
(74) *Attorney, Agent, or Firm*—Alan K. Stewart; W. James Brady, III; Frederick J. Telecky, Jr.

(57) ABSTRACT

A switched capacitor integrator that shares a switched capacitor CAP1 at the input of the integrator for the signal input and the reference capacitor. The operation of the circuit includes discharging the capacitor CAP1 with a first clock signal CK3; transferring an input voltage IN onto the capacitor CAP1 with a second clock signal CK1'; applying a reference voltage REF to a first end of the capacitor CAP1 with a third clock signal CK2; and coupling a second end of the capacitor CAP1 to the integrator with the third clock signal CK2 while the reference voltage REF is applied to the first end of the capacitor CAP1.

2 Claims, 2 Drawing Sheets

SWITCHED CAPACITOR INTEGRATOR THAT SHARES A CAPACITOR FOR INPUT SIGNAL AND REFERENCE SIGNAL

This application claims priority under 35 USC §119 (e) (1) of provisional application No. 60/288,875 filed May 4, 2001.

FIELD OF THE INVENTION

This invention generally relates to electronic systems and in particular it relates to an improved switched capacitor integrator circuit.

BACKGROUND OF THE INVENTION

For low power, it is desirable to share the input and reference capacitors in a switched-capacitor integrator. Unfortunately, this means that the circuit driving the integrator input must discharge this capacitor of the reference charge left over from the previous cycle, then charge it with the input signal. This requires higher bandwidth and power from the driver.

For low power, it is desirable to share a single switched capacitor at the input of an integrator for both the signal input and the reference capacitor. This reduces the total input capacitance by a factor of 4 (for the same KT/C noise) and greatly reduces the load, which the integrator's opamp must drive, thereby allowing it to use less power. Unfortunately, this capacitor sharing causes a few problems. One is the fact that the circuit which drives the input to the integrator must not only charge the input capacitor with signal charge, it must also discharge this capacitor of the charge left on the capacitor from the reference feedback of the previous half-cycle. Normally this would require a high-bandwidth (high power) driving circuit to charge this capacitor.

SUMMARY OF THE INVENTION

A switched capacitor integrator that shares a switched capacitor at the input of the integrator for the signal input and the reference capacitor. The operation of the circuit includes discharging the capacitor with a first clock signal; transferring an input voltage onto the capacitor with a second clock signal; applying a reference voltage to a first end of the capacitor with a third clock signal; and coupling a second end of the capacitor to the integrator with the third clock signal while the reference voltage is applied to the first end of the capacitor.

DETAILED DESCRIPTION OF PREFERRED EMBODIMENTS

Figure 1:
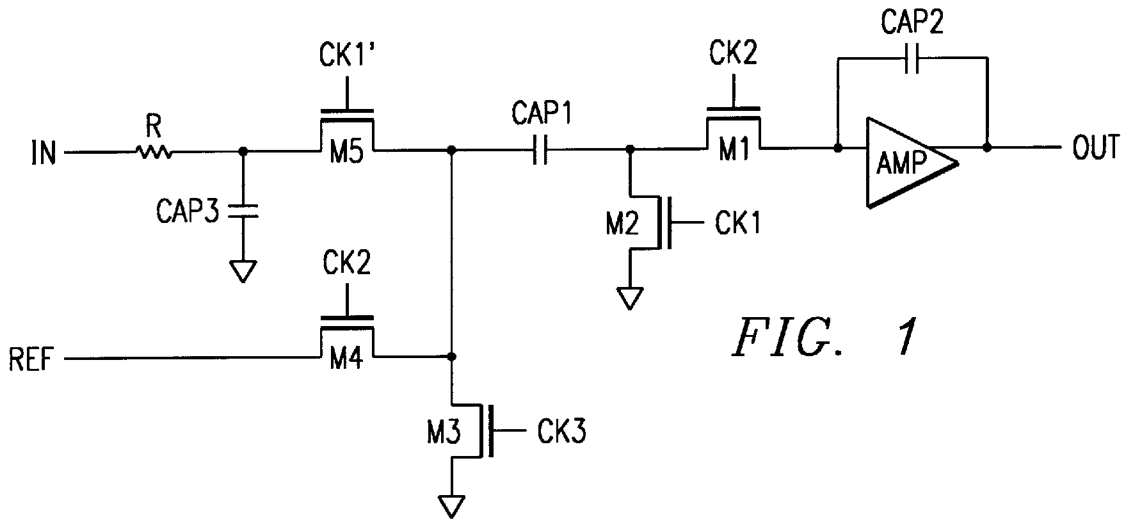
FIG. 1 is schematic circuit diagram of a portion of a preferred embodiment switched capacitor integrator circuit.
Figure 2:
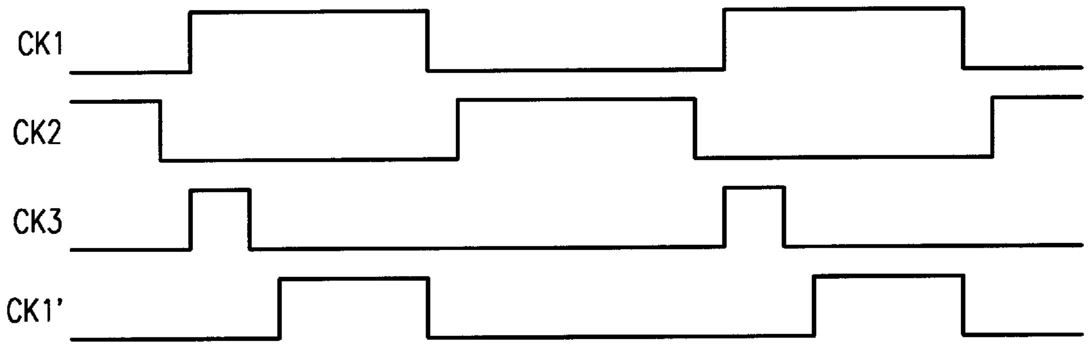
FIG. 2 is a phase diagram of the clocking signals for the circuit of FIG. 1.

A portion of a preferred embodiment switched capacitor integrator circuit is shown in FIG. 1. In order to simplify the description of the circuit, only the portion of the circuit connected to one of the differential inputs and one of the differential outputs of the amplifier is shown. The circuit of FIG. 1 includes: amplifier AMP; transistors M1–M5; capacitors CAP1–CAP3; resistor R; input IN; reference node REF; clocking signals CK1, CK2, CK3, and CK1'; and output OUT. The operation of the circuit of FIG. 1 is described using the phase diagram shown in FIG. 2. CK1 is the sampling phase. CK2 is the reference and integrate phase. CK3 is the discharge phase. CK1' is the modified sampling phase. The circuit of FIG. 1 uses a third clock phase CK3 to discharge the input capacitor CAP1 before phase CK1' switches high to begin the input sampling phase. This greatly relaxes the bandwidth requirement for the input driver, and even allows the use of a passive anti-alias filter. For example, the resistor R and capacitor CAP3, shown in FIG. 1, provide a simple first order passive anti-alias filter. In the prior art devices, an active filter or buffer is required because otherwise the filtered input signal would be corrupted by the reference charge remaining on the input sampling capacitor from the previous integration cycle. Many other passive filter configurations, which are well known in the art, could be used in place of resistor R and capacitor CAP3.

Figure 3:
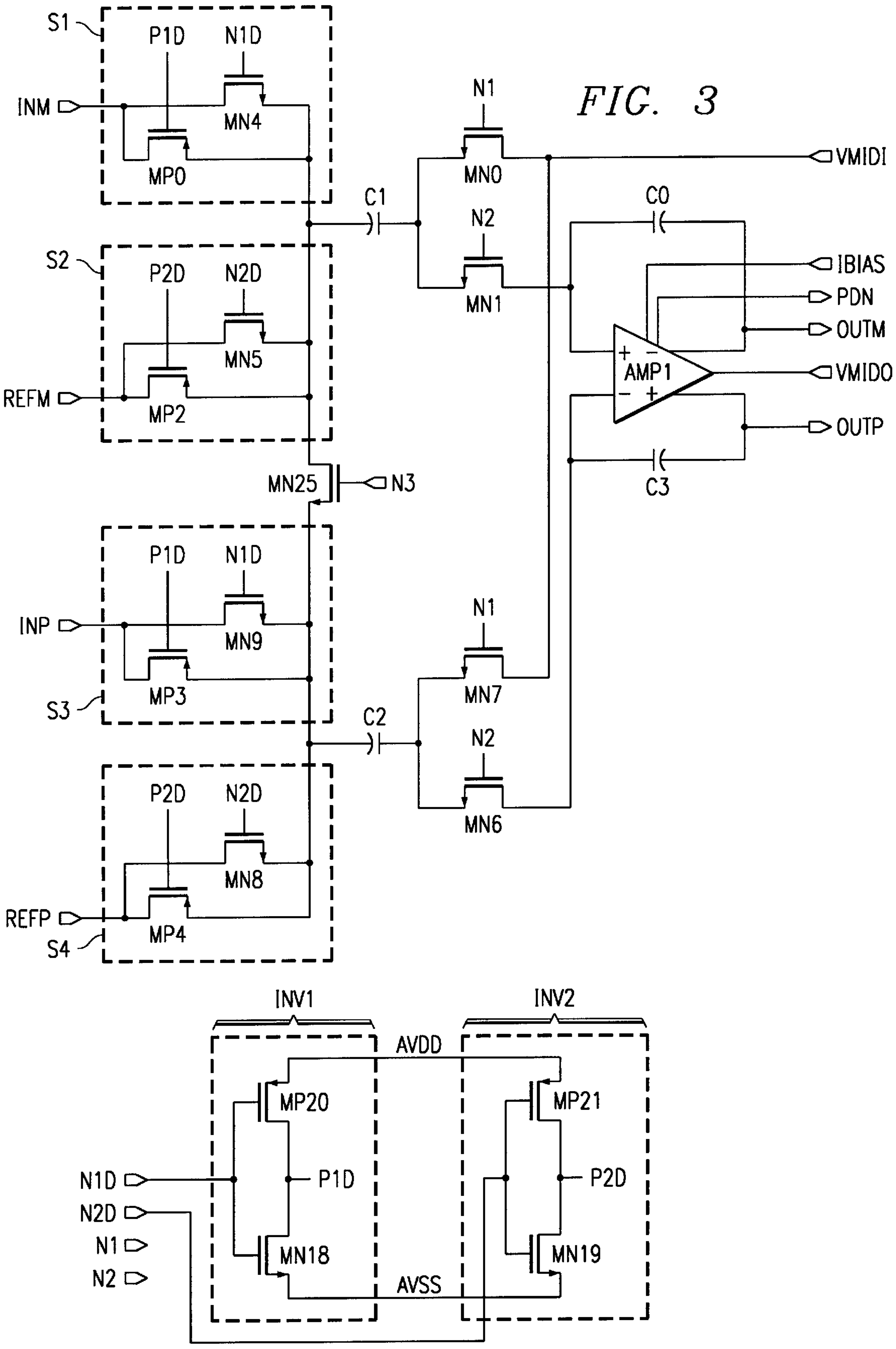
FIG. 3 is a schematic circuit diagram of a preferred embodiment differential switched capacitor integrator circuit.

Shown in FIG. 3 is a preferred embodiment differential switched capacitor integrator circuit. The circuit of FIG. 3 includes: amplifier AMP1; capacitors C0–C3; switches (transistors) MN0, MN1, MN6, and MN7; switches S1–S4 which include transistors MN4, MP0, MN5, MP2, MN9, MP3, MN8, and MP4; inverters INV1 and INV2 which include transistors MN18, MP20, MN19 and MP21; inputs INP and INM; references REFP and REFM; clocking signals N1, N2, N3, N1D, N2D, P1D, and P2D; input middle voltage VMIDI; output middle voltage VMIDO; outputs OUTP and OUTM; bias current IBIAS; power down signal PDN; and supply voltages AVDD and AVSS.

The operation of the differential integrator shown in FIG. 3 consists of three distinct phases: a reset phase, a sampling phase, and an integration phase. During the reset phase, the differential charge remaining on the input sampling capacitors C1 and C2 from the previous integration phase is discharged by turning on transistors MN0, MN7 and MN25. During the sampling phase, the differential input voltage INP and INM is sampled onto the input sampling capacitors C1 and C2 by turning on transistors MN0, MN4, MN7, MN9, MP0 and MP3. During the integration phase, the differential reference voltage REFP and REFM is applied to the bottom plates of the input sampling capacitors C1 and C2 and the top plates of these capacitors C1 and C2 are connected to the inputs of the differential amplifier AMP1 by turning on transistors MN1, MN5, MN6, MN8, MP2 and MP4. This allows the differential charge ((INP−REFP)*C2, (INM−REFM)*C1) to be transferred to the integrating capacitors C3 and C0.

This operation is accomplished by providing the following clock signals, controlling the switching transistors:

| | Phases | | | |
|---|---|---|---|---|
| Clock | Reset | Sampling | Integration | Controls |
| N1 | HI | HI | LO | MN0, MN7 |
| N1D | LO | HI | LO | MN4, MN9 |
| P1D | HI | LO | HI | MP0, MP3 |
| N2 | LO | LO | HI | MN1, MN6 |
| N2D | LO | LO | HI | MN5, MN8 |
| P2D | HI | HI | LO | MP2, MP4 |
| N3 | HI | LO | LO | MN25 |

Note that clocks P1D and P2D are complementary versions of clocks N1D and N2D respectively. Also, clocks N2 and N2D appear to be the same, but in the actual implementation clock N2D is a slightly delayed version of clock N2. This difference is important to the performance of the integrator. Although switches S1–S4 are complementary (parallel NMOS and PMOS transistors), and switches MN0, MN1, MN7, and MN6 are NMOS transistor only, other types of switches can be used.

The integrator circuit of FIG. 1 shows a switch M3 controlled by clock phase CK3 going from the sampling capacitor CAP1 to ground. This switch M3 and its mate in the other half of the differential circuit are replaced by a single switch MN25 in the differential circuit of FIG. 3 which differentially connects the bottom plates of the sampling capacitors C1 and C2. Either scheme—two switches to ground or a single differential switch—can be used.

One of the advantages of the preferred embodiment circuit is that it does not add power to the integrator or the driver, and it only requires a small amount of area.

While this invention has been described with reference to an illustrative embodiment, this description is not intended to be construed in a limiting sense. Various modifications and combinations of the illustrative embodiment, as well as other embodiments of the invention, will be apparent to persons skilled in the art upon reference to the description. It is therefore intended that the appended claims encompass any such modifications or embodiments.

What is claimed is:

1. A circuit comprising:

an amplifier;

a first capacitor coupled between a first input of the amplifier and a first output of the amplifier;

a first switch coupled to the first input of the amplifier and controlled by the first clock signal;

a second capacitor, the first switch is coupled between a first end of the second capacitor and the first input of the amplifier;

a second switch coupled to a second end of the second capacitor for discharging the second capacitor in response to a second clock signal;

a third switch coupled to the second end of the second capacitor for transferring a first input voltage onto the second capacitor in response to a third clock signal;

a forth switch coupled between the second end of the second capacitor and a first reference node, the fourth switch is controlled by the first clock signal;

a third capacitor coupled between a second input of the amplifier and a second output of the amplifier;

a fifth switch coupled to the second input of the amplifier and controlled by the first clock signal;

a fourth capacitor, the fifth switch is coupled between a first end of the fourth capacitor and the second input of the amplifier, the second switch is coupled between a second end of the fourth capacitor and the second end of the second capacitor for discharging the second and fourth capacitors in response to a second clock signal;

a seventh switch coupled to the second end of the fourth capacitor for transferring a second input voltage onto the fourth capacitor in response to the third clock signal; and an eighth switch coupled between the second end of the fourth capacitor and a second reference node, the eighth switch is controlled by the first clock signal.

2. The circuit of claim 1 further comprising:

a ninth switch coupled between the first end of the second capacitor and a common node, and controlled by the fourth clock signal; and a tenth switch coupled between the first end of the fourth capacitor and the common node, and controlled by the fourth clock signal.

* * * * *